United States Patent
Song et al.

(10) Patent No.: US 6,177,324 B1
(45) Date of Patent: Jan. 23, 2001

(54) ESD PROTECTION DEVICE FOR STI DEEP SUBMICRON TECHNOLOGY

(75) Inventors: Jun Song, Singapore (SG); Shyue Fong Quek, Petaling Jaya (MY); Ting Cheong Ang, Singapore (SG); Lap Chan, SF, CA (US)

(73) Assignee: Chartered Semiconductor Manufacturing, Ltd., Singapore (SG)

( * ) Notice: Under 35 U.S.C. 154(b), the term of this patent shall be extended for 0 days.

(21) Appl. No.: 09/428,568

(22) Filed: Oct. 28, 1999

(51) Int. Cl.[7] ................................................. H01L 21/336
(52) U.S. Cl. ............................................. 438/307; 438/364
(58) Field of Search .................................... 438/225, 297, 438/307, 302, 362, 364; 257/355, 360

(56) References Cited

U.S. PATENT DOCUMENTS

| | | | |
|---|---|---|---|
| 5,489,792 | * | 2/1996 | Hu et al. .................................. 257/347 |
| 5,629,544 | * | 5/1997 | Voldman et al. ....................... 257/355 |
| 5,744,841 | * | 4/1998 | Gilbert et al. .......................... 257/360 |
| 5,885,875 | * | 3/1999 | Hsu ......................................... 438/289 |
| 5,910,673 | * | 5/1999 | Hsu et al. ............................... 257/355 |
| 5,918,117 | * | 6/1999 | Yum ....................................... 438/200 |

* cited by examiner

Primary Examiner—David Nelms
Assistant Examiner—Quoc Hoang
(74) Attorney, Agent, or Firm—George O. Saile; Rosemary L. S. Pike

(57) ABSTRACT

A new method is provided for the creation of an ESD protection device for deep submicron semiconductor technology. An STI trench is created and filled with oxide. The surface of the STI region is polished after which a gate structure is created over the STI region. A high energy ESD implant is performed that is self-aligned with the created gate structure after which the EDS device structure is completed by implanting the source and drain regions of the ESD device.

24 Claims, 2 Drawing Sheets

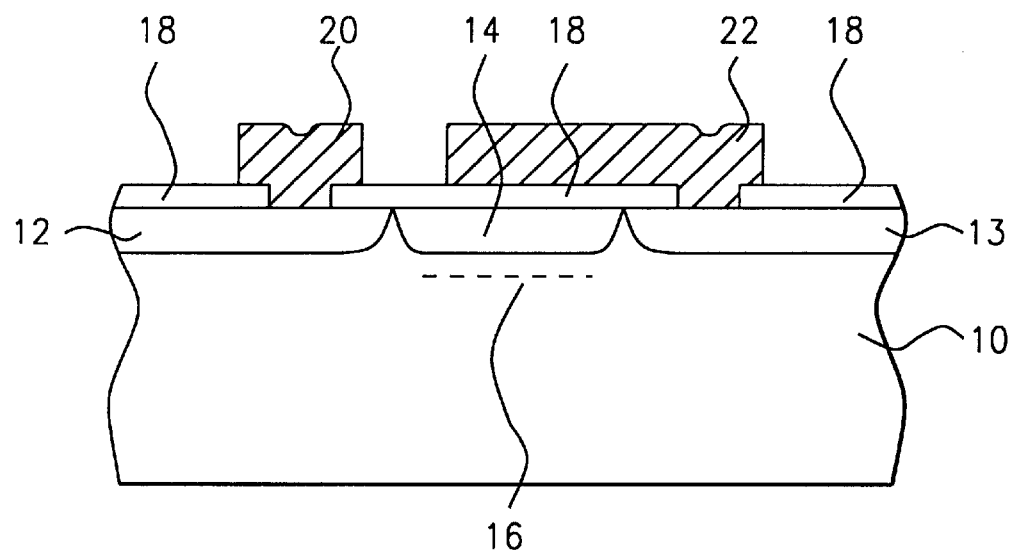
*FIG. 1 — Prior Art*
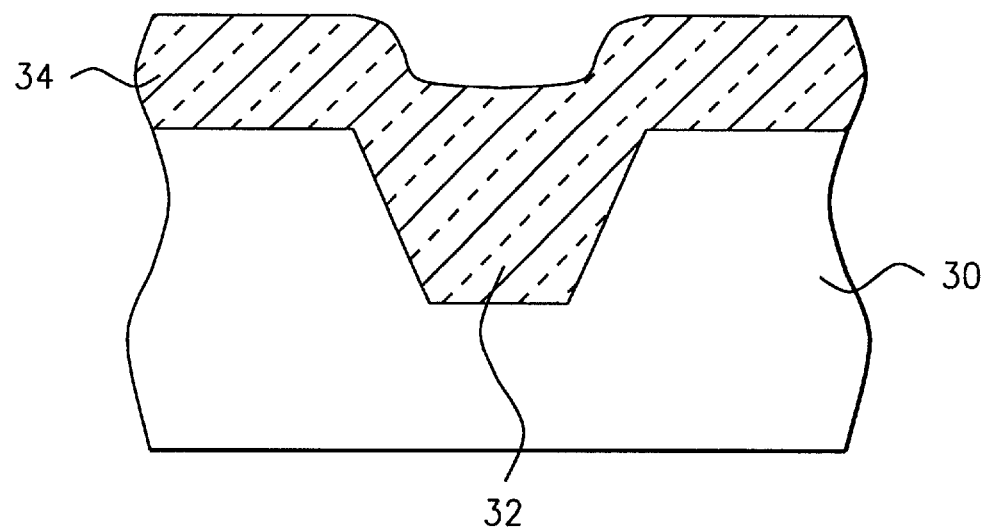
*FIG. 2a*

ESD PROTECTION DEVICE FOR STI DEEP SUBMICRON TECHNOLOGY

BACKGROUND OF THE INVENTION (1) Field of the Invention

The invention relates to the fabrication of integrated circuit devices, and more particularly, to a new and improved method of providing an Electrostatic Discharge (ESD) protection device for the deep sub-micron semiconductor fabrication of Shallow Trench Isolation (STI) regions.

(2) Description of the Prior Art

The continued decrease in semiconductor device feature size, that has been driven by continued efforts in the semiconductor manufacturing industry to improve device performance by reducing device feature size, has made semiconductor devices increasingly vulnerable to Electrostatic Discharge (ESD). ESD can be triggered in a semiconductor device by any unforeseen build up of electromagnetic fields that affect current carrier distribution and existing magnetic fields in the semiconductor device. To prevent this kind of damage an ESD protection circuit is typically included in the design of a semiconductor device. A semiconductor device can for instance also be damaged by a voltage surge that is introduced into the device via a bond pad. This voltage surge can be induced by direct contact with surrounding equipment to which the bond pad is connected or by human contact. The essential function of the ESD protection arrangement is to direct the ESD current away from the circuits that the ESD circuit is designed to protect. ESD circuits are used to protect memory circuits, MOSFET's and other semiconductor device applications for the protection of input/output buffers. Another typical application of ESD circuits relates to the packaging of individual die into multi-chip modules. This latter application typically requires the use of a number of pads that interconnect the individual die into a multi-die package. Furthermore, a single die can be mounted into a test carrier for testing, which also requires the interfacing of the die with the test environment by means of die contact bonds. These contact bonds are subject to introduction of ESD based damage to the device under test leading to the use of ESD circuits for the protection of the semiconductor die. Bond pad leakage in such an arrangement can be between the input and output pads on a die to other pads on the die such as the power pads, ground pads and bias voltage pads. Pad leakage can also occur from a pad to the silicon substrate of a die, or to another component of the die. One cause of pad leakage can be from defective or damaged electrostatic discharge (ESD) circuits formed on the die. Protective ESD circuits are typically located between the input and output pads on the die and the transistor gates to which the pads are electrically connected. The ESD circuits provide in this manner a path of conductance from the input/output pads to a ground pad, or to a power or bias voltage path for the die. This electrical path is designed to be triggered by a high voltage, which is higher than the operating voltage, so that the current can be discharged at a rapid rate once an electrostatic discharge takes place through the input or output pads of the die. Where the ESD circuits are defective or inoperable, the current that is applied to an input or output pad can leak from these pads through the ESD circuit to other pads on the die or to the substrate.

Arrangements of ESD protection circuits are used whereby more than one of these ESD circuits surrounds a bond pad. Typically, an ESD protection circuit will consist of a circuit configuration that contains a resistor, a capacitor and a inductance (or reactance). Some ESD protection circuits may include a primary and a secondary protection circuit. Key to the successful operation of an ESD circuit configuration is that these circuits individually or collectively react fast enough so that any surge in current can be interrupted or deflected in time to protect the surrounding circuits from damage. In order to achieve this objective ESD protection circuits frequently use highly sensitive thin (for instance oxide) films or a transistor design that, by for instance using a thin-film gate oxide layer between the gate electrode and the underlying substrate, will rapidly react to improperly applied voltages and will as a consequence interrupt their normal operation and serve as a protective circuit. It is clear that by careful selection of the various design parameters of such circuits, these ESD protection circuits can be made to operate in a collective manner and in a manner that is sensitive to the level of induced voltages. A primary protection circuit can for instance be electrically isolated (by a resistive load) from the secondary protection circuit such that the interrupting capabilities (determined by for instance the thickness of the oxide layer underlying the gate electrode of the secondary circuit or by the size of the drain structure of this circuit) of the gate electrode can be optimized. These latter observations point to the conventional design approach for the ESD protective circuit of using the design of the drain regions of a gate electrode or the length of the source/drain region (the channel) underlying the gate electrode as the design parameters.

In a typical design of memory circuits, the ESD protection circuit is located adjacent to and in close physical proximity with the memory circuits that may include memory cell arrays and peripheral circuits. The peripheral circuits include NMOS and PMOS transistors. The active regions of the memory circuits are electrically isolated by forming non-active regions between these circuits, these non-active regions are also referred to as field oxide regions and can be formed using any of the conventional approaches such as with the Local Oxidation of Silicon (LOCOS) process or by forming Shallow Trench Isolation (STI) regions. After the surface of the substrate has been defined in this manner (defining the region for the ESD circuit and for the memory circuits whereby the active ESD and memory circuits are electrically separated by field isolation regions), a layer of field oxide is grown over the surface of the substrate. The polarity of the transistors that are to be formed is defined by implanting n-type and p-type impurities in the surface of the substrate thereby defining n-wells and p-wells regions in the substrate. These impurity implants are performed in a sequence of steps using appropriate masking and impurity types and implant energies such that the required conductivity of the transistors that are required (ESD protective circuit, NMOS and PMOS transistor, others) and their supporting regions (source/drain) are provided.

FIG. 1 shows a cross section of a Prior Art ESD protection device that has been created on the surface of a semiconductor substrate 10. The Prior Art cross section that is shown in FIG. 1 is a metal gate field threshold device and contains a layer 14 of field oxide, a source region 12 and a drain region 13 that are adjacent to the field oxide layer 14, a threshold voltage adjustment region 16 underlying the field oxide layer 14, a layer 18 of gate oxide and two metal contacts 20 and 22 that respectively contact the source (12) and drain (13) regions of the ESD protection circuit.

A layer 16 of P-type dopant is typically implanted in substrate 10 under the layer 14 of field oxide. The implant is performed in order to increase the field isolation of the metal gate field threshold device. Due to this implant, the threshold voltage of the device can be raised to in excess of 12 volts. Typical gate widths have been reduced to the point where 0.35 um gate width is applied. With this sharp reduction in gate width comes an equally sharp reduction in the thickness of the gate oxide layer. The gate oxide layer 18 that can be used with a gate width of 0.35 um is between about 60 and 80 Angstrom thick. The breakdown voltage of this layer of gate oxide is about 8 volts. With the reduction in the gate size, the width of the source/drain depletion layer is correspondingly reduced and can approach the channel length of the gate electrode. This readily leads to punch through between the source and the drain whereby the depletion layers of the source and the drain regions touch and the required current control by the gate electrode between the source and the drain is no longer effective. Where, on the other hand, a deep trench is used for the STI region, that is trench 14 in FIG. 1, a thick oxide layer is used for the ESD protection circuit. The trench that is indicated in FIG. 1 is about 3500 Angstrom thick, the layer of oxide is between 100 and 400 Angstrom thick. The invention addresses this application and the use of a very high energy implant that is used to establish a deep enough junction for deep STI trenches. The invention shows an ESD protection device that is entirely over the STI region and that in not over any active region of the device.

U.S. Pat. No. 5,629,544 (Voldman et al.) shows an ESD gate at least partially over an STI region. See FIG. 4A; see cols. 3 and 4.

U.S. Pat. No. 5,744,841 (Gilbert) shows an ESD over a FOX.

U.S. Pat. No. 5,918,117 (Yum) shows an ESD device using STI 42. See col.5, line 43 and col. 7.

U.S. Pat. No. 5,489,792 (Hu et al.) teaches an ESD over a SOI.

U.S. Pat. No. 5,885,875 (Hsu) shows an ESD gate over a fox.

SUMMARY OF THE INVENTION

A principle objective of the invention is to provide a method of creating an ESD protection circuit for deep submicron semiconductor fabrication.

Another objective of the invention is to provide a method of performing deep junctions for deep trenches as applied to the formation of ESD protection circuits.

Yet another objective of the invention is to provide a method of creating ESD protection circuits that overly a STI region as opposed to overlying a region Field Oxide of Prior Art.

In accordance with the objectives of the invention a new method is provided for the creation of an ESD protection device for deep submicron semiconductor technology. An STI trench is created and filled with oxide. The surface of the STI region is polished after which an ESD protection device structure is created over the STI region. A high energy ESD implant is performed that is self-aligned with the created ESD protection device structure after which the ESD device structure is completed by implanting the source and drain regions of the EDS protection device.

BRIEF DESCRIPTION OF THE DRAWINGS

FIG. 1 shows a cross section of a conventional ESD device.

FIGS. 2a through 2c show cross sections of the ESD device of the invention, as follows:

FIG. 2a shows a cross section of a semiconductor surface into which an STI trench has been formed and over which a layer of oxide has been deposited.

FIG. 2b shows cross section of a semiconductor surface after the deposited layer of oxide has been planarized.

FIG. 2c shows a cross section of a semiconductor surface into which an ESD protection device has been created.

DESCRIPTION OF THE PREFERRED EMBODIMENTS

Figure 2B:
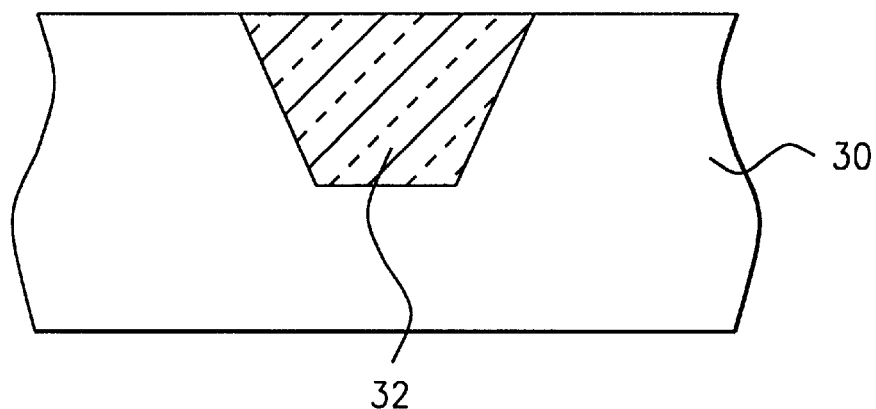
Figure 2C:
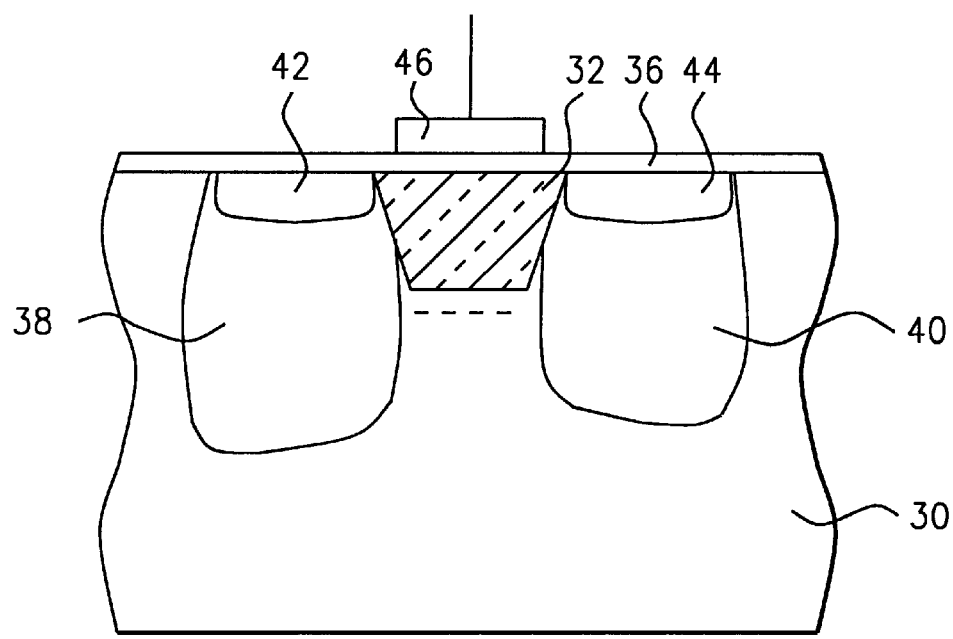

Referring now specifically to FIGS. 2a through 2c, there are shown cross sections of the various stages in the creation of the ESD protection device of the invention.

FIG. 2a shows the creation of the Shallow Trench Isolation region 32 in the surface of a semiconductor substrate 30.

STI can be made using a variety of methods. For instance, one method is the Buried Oxide (BOX) isolation used for shallow trenches. The method involves filling the trenches with a chemical vapor deposition (CVD) of silicon oxide ($SiO_2$) (34, FIG. 2a) which is then etched back or mechanically/chemically polished to yield a planar surface. The shallow trenches etched for the BOX process are anisotropically plasma etched into the silicon substrate and are typically between 0.5 and 0.8 micrometer (um.) deep. STI that are formed around active device are typically formed to a depth between 4000 and 20000 Angstrom.

Another approach in forming STI's is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metalization. The silicon nitride is provided to the silicon to prevent polishing of the masked silicon oxide of the device.

The STI region of the invention is etched in the surface of a substrate to a preferred depth of 0.35 um and is filled with oxide. FIG. 2b shows the STI trench 32 after the process of polishing (Chemical Mechanical Polishing) of the deposited layer 34 (FIG. 2a) of oxide has been completed.

FIG. 2c shows a cross section of the completed ESD device of the invention. A layer 36 of pad oxide is first created over the surface of the substrate 30. Pad oxide is usually formed as a silicon dioxide material but may be a composite oxide, such as TEOS and silicon dioxide, or a nitride oxide layer or a like gate dielectric. Pad oxide layer 36 can be grown in an oxidation steam ambient at a temperature between about 850 and 1000 degrees C. to a thickness between about 50 and 250 angstrom. The gate 46 typically is either polysilicon or amorphous silicon or a combination of both. This layer may be in-situ doped with dopant atoms or ion implanted with dopant atoms to alter the conductivity pattern of this conductive layer. A layer of poly can be deposited to form the gate electrode 46 by low pressure CVD (LPCVD) to a thickness between about 500 and 5000 Angstrom at a temperature between about 500 and 700 degrees C. and in situ doped by ion implantation with $POCl_3$ or using silane as a source and with the addition of phosphine to provide the needed dopant. The poly is patterned using conventional photolithographic techniques to form the poly gate 46.

The region in the surface of the substrate where the subsequent implants are being performed are typically electrically biased by forming p-well or n-well implants into the surface of the substrate. These implants have not been shown in art of the invention for reasons of simplicity of presentation.

The ESD implant is performed to create the the ESD impurity regions 38 and 40 that are respectively aligned with the source region 42 and the drain region 44. This implant is self-aligned with the STI structure 32 and is performed using an energy in excess of 400 KeV with phosphorous or arsenic as an impurity having a concentration of about 2E13 atoms/cm$^2$. This implant results in ESD regions 38 and 40 that extend to about 1.3 um below the surface of the substrate 30 and form therefore extensive (deep) regions of impurity concentrations under the surface of the substrate. The implants 38 and 40 are required to be (deep) implants that penetrate deep enough in accordance with the deep STI trench 32.

As a final step in the creation of the ESD device of the invention, the source 42 and drain 44 regions of the device are created by n-type impurity implant. The implant for the source/drain can use arsenic or phosphorous as a source, the implant being performed with an implant energy of between 50 and 80 KeV and an implant concentration of about 3E15 atoms/cm$^2$.

It is clear from the process described above and from the cross section of the created ESD device that is shown in FIG. 2c that the invention meets the objectives that have previously been stated for the invention, that is:
to provide an ESD protection circuit for deep submicron semiconductor fabrication
to provide deep junctions for deep trenches for ESD protection circuits, and
to provide an ESD protection circuit that overlies a STI region.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for fabricating a low voltage electro-static discharge protective device, comprising the steps of:
    providing a semiconductor substrate;
    forming a Shallow Trench Isolation in the surface of said substrate having a depth of penetration into the surface of said semiconductor substrate;
    forming a pad oxide layer over the surface of said substrate thereby including said STI trench;
    forming a gate structure on the surface of said pad oxide layer said gate structure to align with said STI trench;
    performing a p-well implant into the surface of said substrate;
    performing an electro-static discharge implant into the surface of said substrate whereby said electro-static discharge is self-aligned with said gate structure and wherein said electro-static discharge implant forms regions of electro-static discharge impurity ions that are adjacent to said Shallow Trench Isolation trench and enter into the surface of said substrate to a depth that is larger than the depth of said Shallow Trench Isolation trench; and
    performing a source and a drain implant into the surface of said substrate whereby said source and drain implants are self-aligned with said gate structure.

2. The method of claim 1 wherein said forming a Shallow Trench in the surface of said substrate is forming a trench to the depth of about 0.35 um using conventional methods of STI trench formation.

3. The method of claim 1 wherein said forming a pad oxide layer over the surface of said substrate is using silicon dioxide or a composite oxide, such as TEOS and silicon dioxide, or a nitride oxide layer or a like gate dielectric whereby said gate oxide layer is grown in an oxidation steam ambient at a temperature between about 850 and 1000 degrees C. to a thickness between about 50 and 250 angstrom.

4. The method of claim 1 wherein said forming a gate structure on the surface of said pad oxide layer is depositing a layer of poly using low pressure CVD (LPCVD) to a thickness between about 500 and 5000 Angstrom at a temperature between about 500 and 700 degrees C. whereby said layer of poly is patterned using conventional photolithographic techniques.

5. The method of claim 4 whereby in addition said gate structure is in situ doped by ion implantation with $POCl_3$ or using silane as a source and with the addition of phosphine to provide the needed dopant.

6. The method of claim 1 wherein said performing a p-well implant into the surface of said substrate is implanting boron with an energy of between about 100 and 220 keV and a dose of between about 1e13 and 1e14 atoms/cm$^2$.

7. The method of claim 1 wherein said performing a p-well implant into the surface of said substrate is implanting boron with an energy of between about 5 to 40 keV and a dose between about 1e12 and 5e13 atoms/cm$^2$.

8. The method of claim 1 wherein said performing a p-well implant into the surface of said substrate is implanting indium with an energy between about 50 and 250 keV and a dose between about 1e12 and 1e14 atoms/cm$^2$.

9. The method of claim 1 wherein said performing an electrostatic discharge implant into the surface of said substrate is performing and implant that is self-aligned with said STI structure using phosphorous as an impurity with an energy in excess of 400 KeV and an impurity concentration of about 2E13 atoms/cm$^2$ thereby creating n-type ESD regions in the surface of said substrate that extend to about 1.3 um below the surface of said substrate.

10. The method of claim 1 wherein said performing an electrostatic discharge implant into the surface of said substrate is performing and implant that is self-aligned with said gate structure using arsenic as an impurity with an energy in excess of 400 KeV and an impurity concentration of about 2E13 atoms/cm$^2$ thereby creating n-type ESD regions in the surface of said substrate that extend to about 1.3 um below the surface of said substrate.

11. The method of claim 1 wherein said performing a source and a drain implant into the surface of said substrate is implanting arsenic with an implant energy of between 50 and 80 KeV and an implant concentration of about 3E15 atoms/cm$^2$ thereby creating n-type source and drain regions.

12. The method of claim 1 wherein said performing a source and a drain implant into the surface of said substrate is implanting phosphorous with an implant energy of between 50 and 80 KeV and an implant concentration of about 3E15 atoms/cm$^2$ thereby creating n-type source and drain regions.

13. A method for fabricating a low voltage electro-static discharge protective device, comprising the steps of:
    providing a semiconductor substrate;
    forming a Shallow Trench Isolation trench in the surface of said substrate having a depth of penetration into the surface of said semiconductor substrate;

forming a pad oxide layer over the surface of said substrate thereby including said STI trench;

forming a gate structure on the surface of said pad oxide layer said gate structure to align with said STI trench;

performing a n-well implant into the surface of said substrate;

performing an electro-static discharge implant into the surface of said substrate whereby said electro-static discharge is self-aligned with said STI structure and wherein said electro-static discharge implant forms regions of electro-static discharge impurity ions that are adjacent to said Shallow Trench Isolation trench and enter into the surface of said substrate to a depth that is larger than the depth of said Shallow Trench Isolation trench; and performing a source and a drain implant into the surface of said substrate whereby said source and drain implants are self-aligned with said gate structure.

14. The method of claim 13 wherein said forming a Shallow Trench Isolation trench in the surface of said substrate is forming a trench to the depth of about 0.35 um using conventional methods of STI trench formation.

15. The method of claim 13 wherein said forming a pad oxide layer over the surface of said substrate is using silicon dioxide or a composite oxide, such as TEOS and silicon dioxide, or a nitride oxide layer or a like gate dielectric whereby said gate oxide layer is grown in an oxidation steam ambient at a temperature between about 850 and 1000 degrees C. to a thickness between about 50 and 250 angstrom.

16. The method of claim 13 wherein said forming a gate structure on the surface of said pad oxide layer is depositing a layer of poly using low pressure CVD (LPCVD) to a thickness between about 500 and 5000 Angstrom at a temperature between about 500 and 700 degrees C. whereby said layer of poly is patterned using conventional photolithographic techniques.

17. The method of claim 16 whereby in addition said gate structure is in-situ doped by ion implantation with $POCl_3$ or using silane as a source and with the addition of phosphine to provide the needed dopant.

18. The method of claim 13 wherein said N-well implant uses phosphorus with an energy within the range of between 300 to 600 keV and a dose within the range of between 1e13 to 5e14 atoms/$cm^2$.

19. The method of claim 13 wherein said N-well implant uses phosphorus with an energy within the range of between 50 to 300 keV and a dose within the range of between 1e12 to 5e13 atoms/$cm^2$.

20. The method of claim 13 wherein said N-well implant uses arsenic with an energy within the range of between 50 to 200 keV and a dose within the range of between 1e12 to 1e14 atoms/$cm^2$.

21. The method of claim 13 wherein said performing an electrostatic discharge implant into the surface of said substrate is performing and implant that is self-aligned with said STI structure using boron as an impurity with an energy in excess of 400 KeV and an impurity concentration of about 2E13 atoms/$cm^2$ thereby creating p-type ESD regions in the surface of said substrate that extend to about 1.3 um below the surface of said substrate.

22. The method of claim 13 wherein said performing an electrostatic discharge implant into the surface of said substrate is performing and implant that is self-aligned with said STI structure using indium as an impurity with an energy in excess of 400 KeV and an impurity concentration of about 2E13 atoms/$cm^2$ thereby creating p-type ESD regions in the surface of said substrate that extend to about 1.3 um below the surface of said substrate.

23. The method of claim 13 wherein said performing a source and a drain implant into the surface of said substrate is implanting boron with an implant energy of between 50 and 80 KeV and an implant concentration of about 3E15 atoms/$cm^2$ thereby creating p-type source and drain regions.

24. The method of claim 13 wherein said performing a source and a drain implant into the surface of said substrate is implanting indium with an implant energy of between 50 and 80 KeV and an implant concentration of about 3E15 atoms/$cm^2$ thereby creating p-type source and drain regions.

* * * * *